United States Patent
Yang et al.

(10) Patent No.: US 10,929,633 B2
(45) Date of Patent: Feb. 23, 2021

(54) FINGERPRINT IDENTIFICATION DEVICE, TOUCH DISPLAY PANEL, AND METHOD FOR DRIVING FINGERPRINT IDENTIFICATION DEVICE

(71) Applicant: BOE TECHNOLOGY GROUP CO., LTD., Beijing (CN)

(72) Inventors: Shengji Yang, Beijing (CN); Xue Dong, Beijing (CN); Hailin Xue, Beijing (CN); Xiaochuan Chen, Beijing (CN); Haisheng Wang, Beijing (CN); Yingming Liu, Beijing (CN); Lei Wang, Beijing (CN); Xiaoliang Ding, Beijing (CN); Rui Xu, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 401 days.

(21) Appl. No.: 15/751,848

(22) PCT Filed: Jul. 17, 2017

(86) PCT No.: PCT/CN2017/093157
§ 371 (c)(1),
(2) Date: Feb. 9, 2018

(87) PCT Pub. No.: WO2018/049909
PCT Pub. Date: Mar. 22, 2018

(65) Prior Publication Data
US 2020/0218866 A1 Jul. 9, 2020

(30) Foreign Application Priority Data

Sep. 18, 2016 (CN) .......................... 201610830380.0

(51) Int. Cl.
*G06K 9/00* (2006.01)
*G06F 3/041* (2006.01)
*H01L 51/56* (2006.01)

(52) U.S. Cl.
CPC ......... *G06K 9/0002* (2013.01); *G06F 3/0412* (2013.01); *H01L 51/56* (2013.01)

(58) Field of Classification Search
None
See application file for complete search history.

(56) References Cited

U.S. PATENT DOCUMENTS 7,329,975 B2   2/2008  Sugiura et al.
7,525,237 B2   4/2009  Sugiura et al.
(Continued)

FOREIGN PATENT DOCUMENTS

CN       1740814 A      3/2006
CN     103389824 A     11/2013
(Continued)

OTHER PUBLICATIONS

Chinese Search Report, for Chinese Patent Application No. 201610830380.0, dated Apr. 27, 2017, 11 pages.
(Continued)

*Primary Examiner* — Joseph R Haley
(74) *Attorney, Agent, or Firm* — Kinney & Lange, P.A.

(57) ABSTRACT

Embodiments of the disclosure relate to a fingerprint identification device, a touch display panel, and a method for driving a fingerprint identification device. The fingerprint identification device for identification of a fingerprint of a finger, includes: at least one resonant chamber; and at least one ultrasonic generating and detecting device provided opposite to the at least one resonant chamber; each of the at least one ultrasonic generating and detecting device is configured to generate initial ultrasonic signals having a
(Continued)

frequency which is identical to an initial intrinsic frequency of the resonant chamber in a condition of being untouched by the finger, and each of the at least one ultrasonic generating and detecting device is also configured to convert the ultrasonic signals reflected by ridges and valleys of the finger into electrical signals, and to determine information on pattern of the finger depending on the electrical signals.

2 Claims, 3 Drawing Sheets

(56) References Cited

U.S. PATENT DOCUMENTS

| | | | |
|---|---|---|---|
| 9,507,449 B2 | 11/2016 | Chang et al. | |
| 9,817,108 B2 | 11/2017 | Kuo et al. | |
| 2006/0043843 A1 | 3/2006 | Sugiura et al. | |
| 2007/0040477 A1 | 2/2007 | Sugiura et al. | |
| 2008/0116765 A1 | 5/2008 | Sugiura et al. | |
| 2013/0293499 A1* | 11/2013 | Chang | G06F 3/0412 345/173 |
| 2014/0219521 A1* | 8/2014 | Schmitt | G06K 9/00201 382/124 |
| 2015/0198699 A1 | 7/2015 | Kuo et al. | |
| 2015/0331508 A1* | 11/2015 | Nho | H01L 27/323 345/173 |
| 2015/0357375 A1 | 12/2015 | Tsai et al. | |
| 2017/0108979 A1 | 4/2017 | Lu et al. | |
| 2017/0110504 A1* | 4/2017 | Panchawagh | B06B 1/0207 |
| 2018/0031686 A1 | 2/2018 | Kuo et al. | |
| 2018/0046836 A1* | 2/2018 | Hinger | G06K 9/0002 |

FOREIGN PATENT DOCUMENTS

| | | |
|---|---|---|
| CN | 104793804 A | 7/2015 |
| CN | 105446554 A | 3/2016 |
| CN | 105900112 A | 8/2016 |
| CN | 205691915 U | 11/2016 |
| CN | 106446817 A | 2/2017 |
| KR | 100789971 B1 | 1/2008 |
| WO | 2015089453 A1 | 6/2015 |

OTHER PUBLICATIONS

English Translation of International Search Report & Written Opinion, for PCT Patent Application No. PCT/CN2017/093157, dated Oct. 17, 2017, 24 pages.

* cited by examiner

FINGERPRINT IDENTIFICATION DEVICE, TOUCH DISPLAY PANEL, AND METHOD FOR DRIVING FINGERPRINT IDENTIFICATION DEVICE

CROSS-REFERENCE TO RELATED APPLICATIONS

This application is the national phase of PCT Application No. PCT/CN2017/093157 filed on Jul. 17, 2017, which in turn claims the benefit of Chinese Patent Application Invention No. 201610830380.0 filed on Sep. 18, 2016 in the State Intellectual Property Office of China, the whole disclosure of which is incorporated herein by reference.

BACKGROUND OF THE DISCLOSURE

Field of the Disclosure

Embodiments of the present disclosure relate to the technical field of touch control, and in particular, to a fingerprint identification device, a touch display panel, and a method for driving a fingerprint identification device.

Description of the Related Art

Since fingerprints of one's own remain unchanged, unique during a lifetime, and may be convenient, they have almost become a synonym of biometric feature identification. The fingerprint refers to traces or ridge lines produced by bumpy or dimpled appearance of skin on front surfaces at ends of human fingers. These traces or ridge lines are arranged regularly in different patterns. Starting points, end points, junction points and bifurcation points are referred to as minutiae points of the fingerprints.

Fingerprint identification refers to an identification of fingerprints which is implemented by comparison among minutiae of different fingerprints. The technology of fingerprint identification relates to numerous disciplines such as image processing, pattern recognition, computer vision, mathematical morphology and wavelet analysis and the like. Since fingerprints of different persons essentially differ from one another, and even fingerprints of ten fingers of one person are distinguished from one another distinctively, then the fingerprints may be used for identity identification. And since orientations in which finger stamps may not be exactly the same, then, at different force application points or effort points each time, different degrees of deformation may be produced, resulting in a large amount of fuzzy fingerprints As such, it is vital for the fingerprint identification technology how to extract minutiae of fingerprints and to implement an appropriate match thereof.

SUMMARY OF THE DISCLOSURE

According to an aspect of the exemplary embodiment of the present disclosure, there is provided a fingerprint identification device for identification of a fingerprint of a finger, comprising:

at least one resonant chamber; and at least one ultrasonic generating and detecting device provided opposite to the at least one resonant chamber;

each of the at least one ultrasonic generating and detecting device is configured to generate initial ultrasonic signals having a frequency which is identical to an initial intrinsic frequency of the resonant chamber in a condition of being untouched by the finger, and each of the at least one ultrasonic generating and detecting device is also configured to convert the ultrasonic signals reflected by ridges and valleys of the finger into electrical signals, and to determine information on pattern of the finger depending on the electrical signals.

According to an embodiment of the disclosure, each of the at least one ultrasonic generating and detecting device comprises a first electrode layer, a piezoelectric material layer, and a second electrode layer which are provided sequentially.

According to an embodiment of the disclosure, the fingerprint identification device comprises: a plurality of ultrasonic generating and detecting devices and a plurality of resonant chambers; and the plurality of ultrasonic generating and detecting devices are provided in an one-to-one correspondence with the plurality of resonant chambers.

According to an embodiment of the disclosure, the plurality of ultrasonic generating and detecting devices are arranged to be overlapping and aligned with the plurality of resonant chambers in an one-to-one correspondence with each other.

According to an embodiment of the disclosure, the first electrode layers of the plurality of ultrasonic generating and detecting devices are provided as one of an entire common electrode layer and an integrally connected common electrode layer; and the second electrode layers of the plurality of ultrasonic generating and detecting devices are provided individually and separately from one another.

According to an embodiment of the disclosure, the second electrode layers of the plurality of ultrasonic generating and detecting devices which are provided individually and separately from one another are connected with ICs of a control circuit via respective metal wires, respectively.

According to an embodiment of the disclosure, the second electrode layers of the plurality of ultrasonic generating and detecting devices are provided as one of an entire common electrode layer and an integrally connected common electrode layer; and the first electrode layers of the plurality of ultrasonic generating and detecting devices are provided individually and separately from one another.

According to an embodiment of the disclosure, the first electrode layers of the plurality of ultrasonic generating and detecting devices which are provided individually and separately from one another are connected with ICs of a control circuit via respective metal wires provided therebelow, respectively.

According to another aspect of the exemplary embodiment of the present disclosure, there is provided a touch display panel, comprising above fingerprint identification device.

According to an embodiment of the disclosure, the touch display panel is one of an OLED panel and a LCD panel.

According to yet another aspect of the exemplary embodiment of the present disclosure, there is provided a method for manufacturing a touch display panel, comprising:

forming a resonant chamber and an ultrasonic generating and detecting device provided opposite to the resonant chamber, on a substrate.

According to an embodiment of the disclosure, the touch display panel is an OLED display panel, and the method comprises:

forming the ultrasonic generating and detecting device on the substrate; and forming an insulating layer on the ultrasonic generating and detecting device, and forming on the insulating layer a resonant chamber which is provided corresponding to the ultrasonic generating and detecting device.

According to an embodiment of the disclosure, forming on the insulating layer a resonant chamber which is provided corresponding to the ultrasonic generating and detecting device comprises:

forming an anode layer of an OLED light emitting unit of the OLED display panel on the insulating layer;

forming a blocking wall structure on the anode layer by exposure and development;

forming a light-emitting layer structure of the OLED light emitting unit by evaporation outside the blocking wall structure by a high-precision metal masking process; and forming a cathode layer on the light-emitting layer structure of the OLED light emitting unit and inside the blocking wall structure by a full-surface evaporation method; and the blocking wall structure has a height larger than or equal to that of the OLED light emitting unit.

According to an embodiment of the disclosure, forming on the insulating layer a resonant chamber which is provided corresponding to the ultrasonic generating and detecting device further comprises:

covering a top portion of the blocking wall structure by a packaging glass, such that the packaging glass, the substrate and the blocking wall structure define thereamong collectively the resonant chamber which is hollow.

According to still yet another aspect of the exemplary embodiment of the present disclosure, there is provided a method for driving a fingerprint identification device, wherein the method is used to drive the fingerprint identification device described above and comprises:

connecting the ultrasonic generating and detecting device to a high-frequency driving signal so as to generate the initial ultrasonic signals having a frequency which is identical to the initial intrinsic frequency of the resonant chamber in a condition of being untouched by the finger;

converting both the ultrasonic signals reflected by ridges of the finger and the ultrasonic signals reflected by valleys of the finger which has an enlarged amplitude into the electrical signals, by the ultrasonic generating and detecting device; and determining locations on the finger corresponding to the ridges thereof and locations on the finger corresponding to the valleys thereof, by determining information on pattern of the finger depending on the electrical signals, by the ultrasonic generating and detecting device;

and locations on the finger where the electrical signals are relatively strong are determined as valleys, and locations on the finger where the electrical signals are relatively weak are determined as ridges.

BRIEF DESCRIPTION OF THE DRAWINGS

The above and other features and advantages of the present disclosure will become more apparent and a more comprehensive understanding of the present disclosure can be obtained, by describing in detail exemplary embodiments thereof with reference to the accompanying drawings, in which.

DETAILED DESCRIPTION OF PREFERRED EMBODIMENTS

Figure 1:
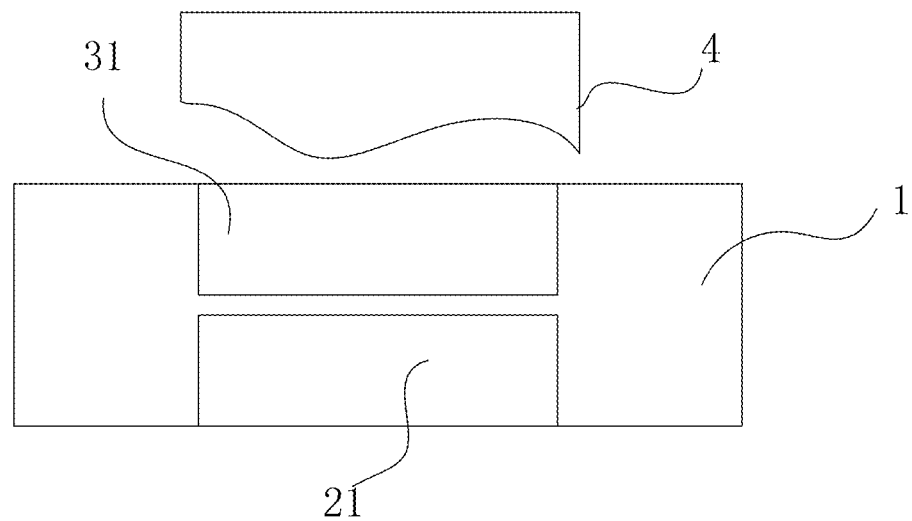
FIG. 1 illustrates a structural schematic view of a finger identification device according to an embodiment of the disclosure.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Respective dimension and shape of each component in the drawings are only intended to exemplarily illustrate the contents of the disclosure, rather than to demonstrate the practical dimension or proportion of components of the fingerprint identification device and the touch display panel.

In the related art, the technology for extracting minutiae of fingerprint images mainly comprises following types, such as an optical scanning apparatus, a temperature-difference sensing fingerprint sensor, a semiconductor fingerprint sensor, and the like.

As far as an identification technology implemented by the optical scanning apparatus is concerned, one finger is put on an optical lens and irradiated by a built-in light source of the optical scanning apparatus, by projecting the light emitted from the built-in light source onto a charge coupled device (CCD) through a prism, such that a multi-grey level fingerprint image is formed which has black ridge lines (i.e., referring to traces or texture lines in patterns of the fingerprint, each line having a certain width and orientation) and white valley lines (i.e., referring to dimpled or depressed portions between adjacent ridge lines) and is digitalized so as to be further processed by an algorithm of a fingerprint processing apparatus.

As far as an identification technology implemented by the temperature-difference sensing sensor is concerned, it is also referred to as "sliding fingerprint identification", which may obtain the fingerprint image within 0.1 second, with a minimized volume and surface area of the sensor. However, it also suffers from some disadvantages. For example, such an identification technology is restricted by a temperature limitation, i.e., a thermal balance may be achieved over time such that the finger and the chip may be at a same temperature.

As far as an identification technology implemented by a semiconductor silicon sensing fingerprint sensor is concerned, it is implemented depending on differences in values of capacitances formed between ridges and valleys of a finger and semiconductor capacitance sensing particles of the sensor so as to determine which positions are ridges and which positions are valleys. Its working process is set forth in detail as below: capacitance sensing particles on each pixel point are pre-charged to a certain reference voltage; once the finger touches a semiconductor capacitance fingerprint sensing surface, since the ridges are projections/bulges and the valleys are depressions/dimples, then, different capacitance values may be formed at positions corresponding to the ridges and at positions corresponding to the valleys respectively, on surfaces of the semiconductor capacitance sensing particles of the semiconductor fingerprint sensor, depending on specific relationship between capacitance values and distances. Then discharge is carried out by a discharging current. Since capacitance values at positions corresponding to the ridges differ from those at positions corresponding to the valleys, the rate at which the discharge is carried out at positions corresponding to the ridges also differs from that at positions corresponding to the valleys. The pixels below the ridges discharge more slowly (due to relatively higher capacitance thereof) while the pixels below the valleys discharge faster (due to relatively lower capacitance thereof). Depending on different discharge rates, positions of the ridges and positions of the valleys may be detected so as to form fingerprint image data.

Figure 2:
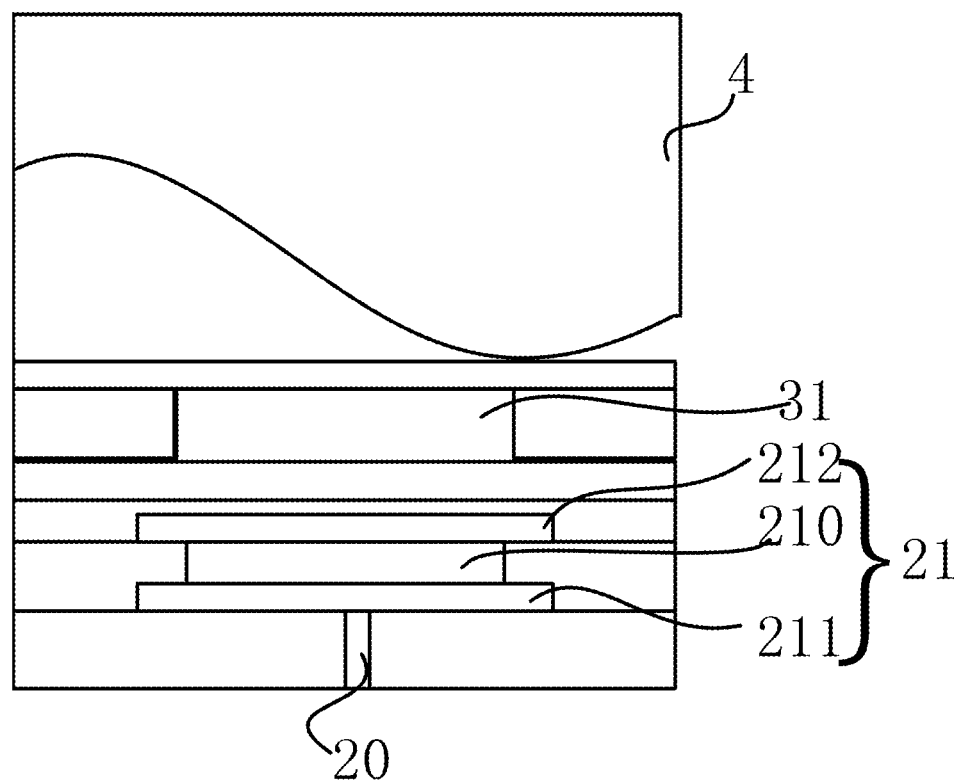
FIG. 2 illustrates a structural schematic view of a finger identification device according to an embodiment of the disclosure.

According to a general technical concept of the present disclosure, as illustrated in FIG. 1 and FIG. 2, there is provided a fingerprint identification device, comprising: an ultrasonic generating and detecting device 21 and a resonant chamber 31 provided opposite to each other; the ultrasonic generating and detecting device 21 is configured to generate initial ultrasonic signals having a frequency which is identical to an initial intrinsic frequency of the resonant chamber 31 in a condition of being untouched by the finger, and the ultrasonic generating and detecting device 21 is also configured to convert the ultrasonic signals reflected by ridges and valleys of the finger 4 into electrical signals, and to determine information on pattern of the finger depending on the electrical signals. The fingerprint identification device provided by the embodiments of the disclosure is set forth in detail hereinafter.

Figure 3:
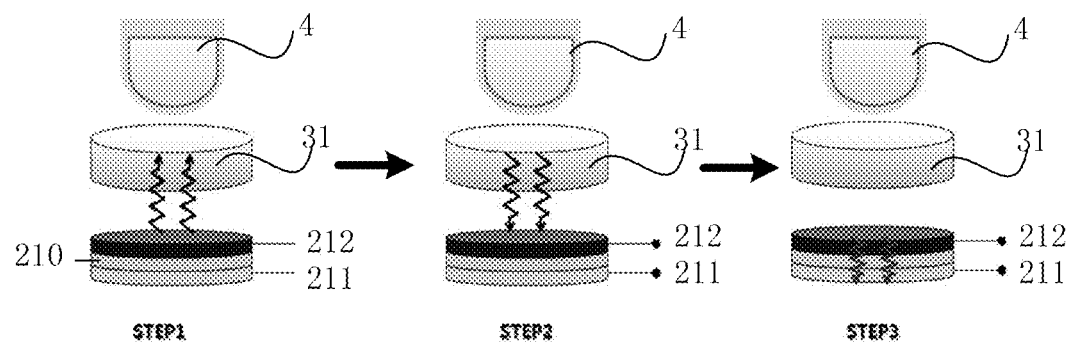
FIG. 3 illustrates a schematic view of an operation principle of a finger identification of the finger identification device as illustrated in FIG. 2.

In embodiments of the disclosure, as illustrated in FIG. 2 and FIG. 3, a volume and a structure of the resonant chamber 31 is determined by design; and once the design is completed, its resonant frequency is fixed already. And when a frequency of an ultrasonic wave produced by the ultrasonic generating and detecting device 21 is the same as a frequency of the resonant chamber 31, a resonance is generated within the resonant chamber 31, such that an amplitude of the ultrasonic wave which passes therethrough is enlarged so as to maximize the amplitude. The ultrasonic generating and detecting device 21 generates the ultrasonic wave which in turn transmits/propagates towards the resonant chamber 31. Since the frequency of the ultrasonic wave is identical to the intrinsic frequency of the resonant chamber 31, the ultrasonic wave which passes through the resonant chamber is subjected to an effect of the resonance, and then exits the resonant chamber with an enlarged amplitude. The ridges of the finger 4 project relative to the valleys of the finger so as to get in touch with the resonant chamber 31 and in turn to change the intrinsic frequency of the resonant chamber 31, such that the resonant chamber 31 may not enlarge the amplitude of the ultrasonic wave transmitted outwards the substrate; and after the resonant chamber 31 receives the ultrasonic wave reflected by the ridges of the finger, there is no resonance occurring within the resonant chamber 31 such that the amplitude of the ultrasonic chamber may not be changed hereby. The valleys of the finger are recessed relative to the ridges of the finger so as to avoid or get rid of any touch with the resonant chamber 31 and fail to change the intrinsic frequency of the resonant chamber 31, such that there occurs the resonance within the resonant chamber 31 and the resonant chamber 31 may enlarge the amplitude of the ultrasonic wave transmitted outwards the substrate; and after the resonant chamber 31 receives the ultrasonic wave which is reflected by the valleys of the finger and thus has a differentiated amplitude thereof, another resonance occurs once again within the resonant chamber 31 so as to further enlarge the amplitude of the ultrasonic wave after the resonance.

In an embodiment of the disclosure, as illustrated in FIG. 2 and FIG. 3, a single ultrasonic generating and detecting device 21 comprises a first electrode layer 211, a piezoelectric material layer 210, and a second electrode layer 212 which are provided on the substrate 1 sequentially, e.g., by disposing sequentially to be overlapping with one another from the bottom up. A common line is used as both a driving line and a detecting line for each of the first electrode layer 211 and the second electrode layer 212 of the ultrasonic generating and detecting device 21. Specifically, in a stage during which the ultrasonic wave is generated, the common line which functions as the driving line applies a high-frequency drive persistently and continuously on at least one of the first electrode layer 211 and the second electrode layer 212 of the ultrasonic generating and detecting device 21 such that the piezoelectric material layer 210 generates the ultrasonic wave. In another stage during which the ultrasonic wave is received, the common line is switched to be converted from the driving line into the detecting line, and since the finger which is in touch with the ultrasonic generating and detecting device 21 has both valleys and ridges provided thereon, then there is a difference in amplitudes of the ultrasonic wave within the resonant chamber caused by the valleys and the ridges, and the amplitudes of the ultrasonic wave which functions as a feedback from the second electrode layer 212 after being subjected to the resonance may also produce different positive piezoelectric effects on the piezoelectric material layer 210. As such, the first electrode layer 211 captures different voltage signals applied thereon, so as to detect and distinguish the difference in the valleys and the ridges of the finger.

Figure 4:
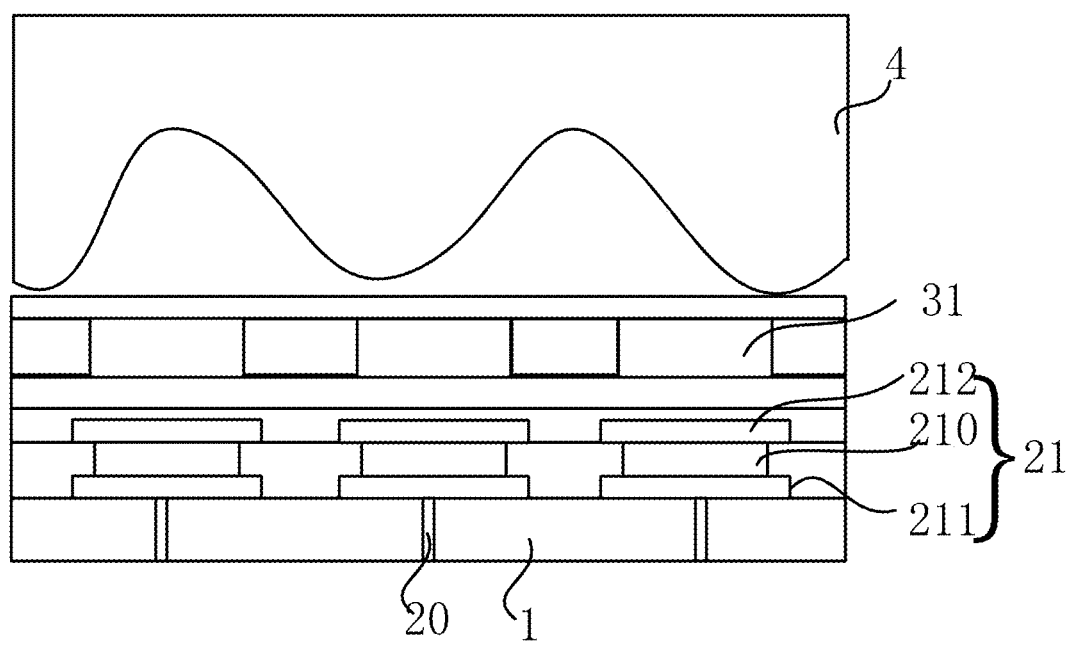
FIG. 4 illustrates a structural schematic view of a finger identification device according to an embodiment of the disclosure.

In an embodiment of the disclosure, as illustrated in FIG. 4, the fingerprint identification device comprises a plurality of ultrasonic generating and detecting devices 21 and a plurality of resonant chambers 31; and the plurality of ultrasonic generating and detecting devices 21 are provided in an one-to-one correspondence with the plurality of resonant chambers 31, for example, the plurality of ultrasonic generating and detecting devices 21 are arranged to be overlapping and aligned with the plurality of resonant chambers 31 in an one-to-one correspondence with each other. As illustrated in FIG. 3, each of the plurality of ultrasonic generating and detecting devices 21 is further arranged to be aligned with locations of the valleys and the ridges of the finger. The plurality of ultrasonic generating and detecting devices 21 are provided in an one-to-one correspondence with the plurality of resonant chambers 31 so as to identify location of each fingerprint, facilitating an effective improvement in accuracy of fingerprint identification.

In an exemplary embodiment of the disclosure, specifically, by way of example, the second electrode layer 212 of the plurality of ultrasonic generating and detecting devices 21 is divided into several mall regions which are separate and independent from one another on a basis of per ultrasonic generating and detecting device 21, i.e., being divided into a plurality of second electrode layers 212; and the first electrode layer 211 of the plurality of ultrasonic generating and detecting devices 21 is also divided into several mall regions which are separate and independent from one another on a basis of per ultrasonic generating and detecting device 21, i.e., being divided into a plurality of first electrode layers 211 each of which is provided in one-to-one correspondence with corresponding one of the plurality of second electrode layers 212 in a same ultrasonic generating and detecting device 21. And the second electrode layer 212 or the first electrode layer 211 of each of the plurality of ultrasonic generating and detecting devices 21 is connected respectively outwards via a respective metal wire 20, e.g., to an IC (i.e., integrated circuit) of a control circuit.

Figure 5:
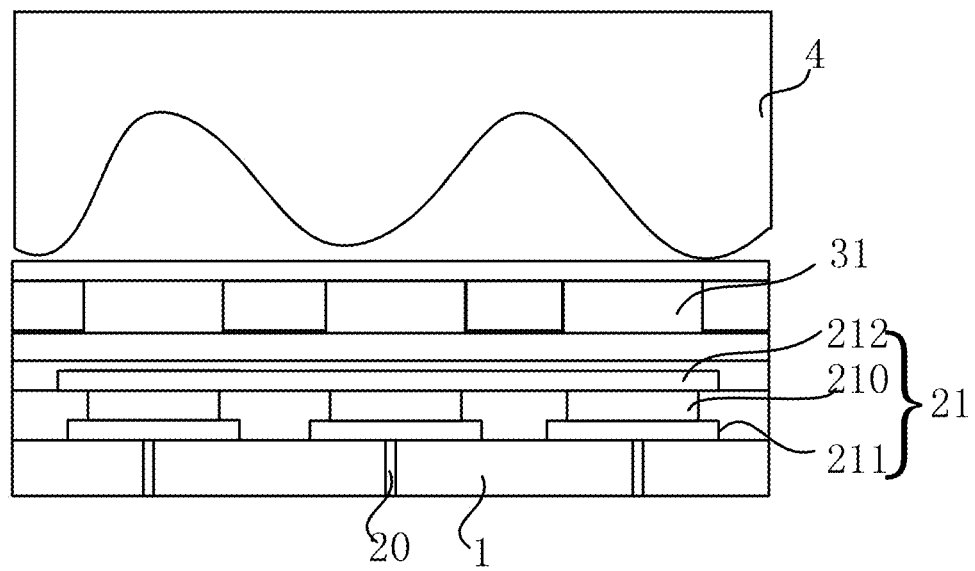
FIG. 5 illustrates a structural schematic view of a finger identification device according to an embodiment of the disclosure.

In an exemplary embodiment of the disclosure, by way of example, in order to further decrease difficulty in machining/processing, the first electrode layers 211 (or the second electrode layers 212) of the plurality of ultrasonic generating and detecting devices 21 are provided as a single entire common electrode layer which is formed integrally, or as an integrally connected common electrode layer. As illustrated in FIG. 5, for example, the second electrode layers 212 of the plurality of ultrasonic generating and detecting devices 21 are provided as an entire common electrode layer, or an integrally connected common electrode layer; and the first electrode layers 211 of the plurality of ultrasonic generating and detecting devices are provided individually and separately from one another and connected with ICs of a control circuit via respective metal wires provided therebelow, respectively, on a basis of per ultrasonic generating and detecting device 21. Alternatively, by way of example, the first electrode layers 211 of the plurality of ultrasonic generating and detecting devices 21 are provided as an entire common electrode layer, or an integrally connected common electrode layer; and the second electrode layers 212 of the plurality of ultrasonic generating and detecting devices are provided individually and separately from one another and connected with ICs of a control circuit via respective metal wires, respectively, on a basis of per ultrasonic generating and detecting device 21.

In order to further manifest or demonstrate superiority/advantages of the fingerprint identification device provided by the embodiments of the disclosure, a touch display panel is further provided by embodiments of the disclosure, comprising aforementioned fingerprint identification device. And a substrate on which the fingerprint identification device is provided may be any one of an OLED panel, a LCD panel and the like. By integrating on the substrate the fingerprint identification device which is configured to generate an ultrasonic wave and transmit it outwards the substrate, to further sense ultrasonic wave reflected by the valleys and ridges of the finger in touch with the fingerprint identification device and to determine information on pattern of the finger depending on the ultrasonic wave reflected by the valleys and the ridges of the finger, the touch display panel is obtained which has a relatively simple structure and facilitates an effective improvement in accuracy of fingerprint identification.

In order to further manifest or demonstrate superiority/advantages of the fingerprint identification device provided by the embodiments of the disclosure, a method for manufacturing a touch display panel is further provided by embodiments of the disclosure, which method is used to manufacture the aforementioned substrate as an array substrate. The method comprises forming a resonant chamber 31 and an ultrasonic generating and detecting device 21 provided opposite to each other, on the substrate. The method for manufacturing the substrate for ultrasonic fingerprint identification as provided in embodiments of the disclosure is set forth in detail hereinafter.

Figure 6:
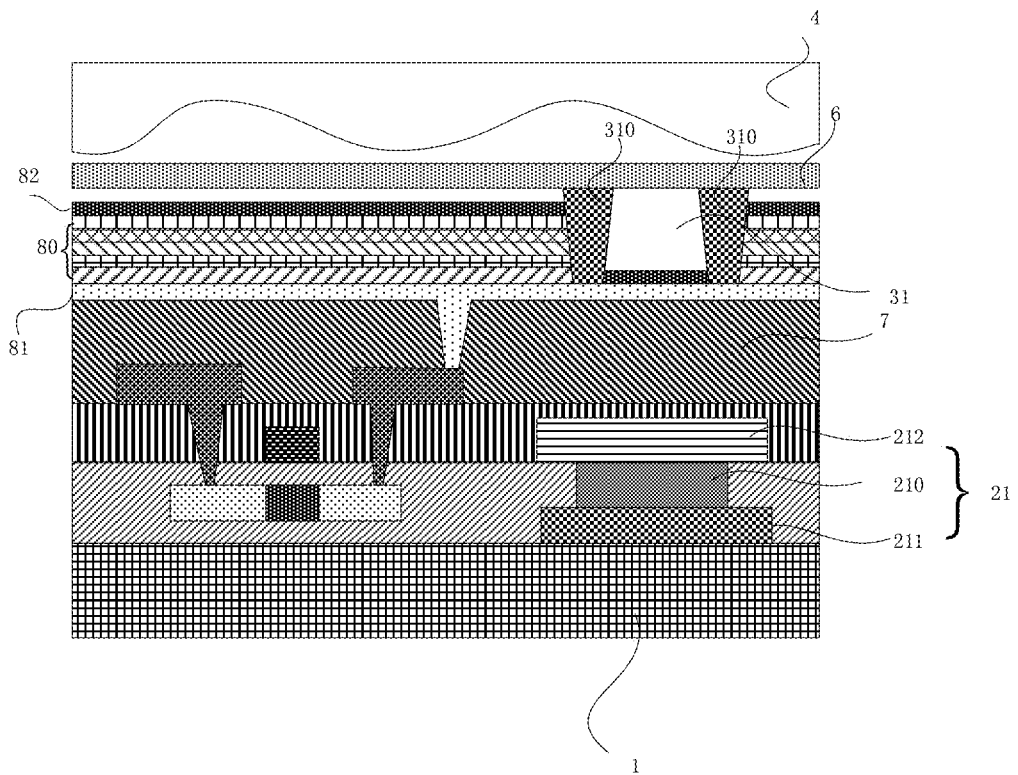
FIG. 6 illustrates a structural schematic view of an OLED ultrasonic fingerprint identification substrate according to an embodiment of the disclosure.

As illustrated in FIG. 6, the touch display panel is an OLED panel, and the method comprises: forming the ultrasonic generating and detecting device 21 on the substrate 1; and forming an insulating layer 7 on the ultrasonic generating and detecting device 21, and forming on the insulating layer 7 a resonant chamber 31 which is provided corresponding to the ultrasonic generating and detecting device 21, for example, the ultrasonic generating and detecting device 21 and the resonant chamber 31 are arranged to be overlapping and aligned with each other in a vertical direction.

As illustrated in FIG. 6, forming on the insulating layer a resonant chamber 31 which is provided corresponding to the ultrasonic generating and detecting device comprises: forming an anode layer 81 of an OLED light emitting unit of the OLED display panel on the insulating layer 7; forming a blocking wall structure 310 on the anode layer 81 by exposure and development; forming a light-emitting layer structure 80 of the OLED light emitting unit by evaporation outside the blocking wall structure 310 by a high-precision metal masking process; and forming subsequently a cathode layer 82 of the light emitting unit on the light-emitting layer structure 80 of the OLED light emitting unit and inside the blocking wall structure 310 by a full-surface evaporation method; the blocking wall structure 310 has a height larger than or equal to that of the whole OLED light emitting unit.

In an exemplary embodiment of the disclosure, by way of example, the insulating layer 7, the light emitting layer structure 80 and the like are formed by an evaporation implemented by a Fine Metal Mask process (FMM Mask). And the second electrode layer 82 of the light emitting unit is formed by a conventional open masking process. In embodiments of the disclosure, the height of the blocking wall structure 310 is set to be sufficiently large, such that after a packaging process is completed, a packaging glass 6 which covers a top portion of the blocking wall structure 310 may fit with the substrate located therebelow and the blocking wall structure 310 to define thereamong collectively the resonant chamber 31 which is hollow.

In order to further manifest or demonstrate superiority/advantages of the fingerprint identification device provided by the embodiments of the disclosure, a method for driving a fingerprint identification device is further provided by embodiments of the disclosure, comprising: connecting the ultrasonic generating and detecting device 21 to a high-frequency driving signal so as to generate the initial ultrasonic signals having a frequency which is identical to the initial intrinsic frequency of the resonant chamber in a condition of being untouched by the finger; converting both the ultrasonic signals reflected by ridges of the finger and the ultrasonic signals reflected by valleys of the finger which has an enlarged amplitude into the electrical signals, by the ultrasonic generating and detecting device 21; and determining locations on the finger corresponding to the ridges thereof and locations on the finger corresponding to the valleys thereof, by determining information on pattern of the finger depending on the electrical signals, by the ultrasonic generating and detecting device, i.e., locations on the finger where the electrical signals are relatively strong are determined as valleys, and locations on the finger where the electrical signals are relatively weak are determined as ridges. The method for driving a fingerprint identification device provided by the embodiments of the disclosure is set forth in detail hereinafter.

As illustrated in FIG. 2 and FIG. 3, firstly, a high-frequency drive is applied persistently and continuously on the first electrode layers 211 and the second electrode layer 212 of the ultrasonic generating and detecting device 21, such that an initial ultrasonic wave is generated by the piezoelectric material layer 210 between the first electrode layer 211 and the second electrode layer 212, which initial ultrasonic wave has a frequency identical to the resonant frequency of the resonant chamber 31.

As illustrated in FIG. 2 and FIG. 3, secondly, once a finger presses against a screen of the display panel, locations of the ridges are in touch with the device such that the intrinsic frequency of the resonant chamber 31 where the locations of the ridges are in touch with the device is changed and the resonant chamber 31 may not enlarge the amplitude of the ultrasonic wave; and the ultrasonic wave which is originally resonant and then reflected into the resonant chamber 31 may neither resonate nor change the amplitude of the ultrasonic wave. In comparison, locations of the valleys are not in touch with the device such that the resonant frequency of the resonant chamber 31 to the locations of which the valleys are positioned exactly opposite may not be changed and the ultrasonic wave resonates within the resonant chamber 31 such that the resonant chamber 31 enlarges the amplitude of the ultrasonic wave transmitted outwards the substrate; after the resonant chamber 31 receives the ultrasonic wave which is reflected by the valleys of the finger, the received ultrasonic wave further resonate with the resonant chamber so as to increase the amplitude of its own. Due to the difference in changing the intrinsic frequency of the resonant chamber 31 by the valleys and the ridges, the amplitude of the ultrasonic wave which is reflected once again into the resonant chamber at the locations of the valleys may be increased by the resonant chamber, but the amplitude of the ultrasonic wave at the locations of the ridges remain unchanged.

As illustrated in FIG. 2 and FIG. 3, thirdly, functionalities of the first electrode layer 211 and the second electrode layer 212 of the ultrasonic generating and detecting device 21 are changed respectively, and the common line is switched to be converted from the driving line into the detecting line, and the second electrode layer 212 is provided as an entire common electrode layer to which a fixed potential is inputted. Since there is a difference in amplitudes of the ultrasonic wave within the resonant chamber due to valleys and ridges, the ultrasonic wave which functions as a feedback may act on the piezoelectric material layer 210 between the first electrode layer 211 and the second electrode layer 212 and hereby produce different positive piezoelectric effects on the piezoelectric material layer 210, and voltage signals which are caused hereby and then captured on the first electrode layer 211 may differ from each other. A ultrasonic wave signal which functions as a feedback from the locations of the ridges may produce a relatively lower positive piezoelectric effect on the piezoelectric material layer 210, and the ultrasonic wave signal which functions as a feedback from the locations of the valleys may produce a relatively high positive piezoelectric effect on the piezoelectric material layer 210, so as to detect and distinguish the difference in the valleys and the ridges of the finger.

In conclusion, the fingerprint identification device, the touch display panel and the method for driving the fingerprint identification device are provided in embodiments of the disclosure; by integrating on the substrate the fingerprint identification device which is configured to generate an ultrasonic wave and transmit it outwards the substrate, to further sense ultrasonic wave reflected by the valleys and ridges of the finger in touch with the fingerprint identification device and to determine information on pattern of the finger depending on the ultrasonic wave reflected by the valleys and the ridges of the finger, the fingerprint identification device may be provided with a relatively simple structure and facilitates an effective improvement in accuracy of fingerprint identification.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although the disclosure is described in view of the attached drawings, the embodiments disclosed in the drawings are only intended to illustrate the preferable embodiment of the present disclosure exemplarily, and should not be deemed as a restriction thereof.

Although several exemplary embodiments of the general concept of the present disclosure have been shown and described, it would be appreciated by those skilled in the art that various changes or modifications may be made in these embodiments without departing from the principles and spirit of the disclosure and lie within the scope of present application, which scope is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:
1. A method for manufacturing a touch display panel, comprising:
   forming a resonant chamber and an ultrasonic generating and detecting device provided opposite to the resonant chamber, on a substrate,
   wherein the touch display panel is an OLED display panel, and wherein the method comprises:
      forming the ultrasonic generating and detecting device on the substrate; and
      forming an insulating layer on the ultrasonic generating and detecting device, and forming on the insulating layer the resonant chamber which is provided opposite to the ultrasonic generating and detecting device,
   wherein forming on the insulating layer the resonant chamber which is provided opposite to the ultrasonic generating and detecting device comprises:
      forming an anode layer of an OLED light emitting unit of the OLED display panel on the insulating layer;
      forming a blocking wall structure on the anode layer by exposure and development;
      forming a light-emitting layer structure of the OLED light emitting unit by evaporation outside the blocking wall structure by a high-precision metal masking process; and forming a cathode layer on the light-emitting layer structure of the OLED light emitting unit and inside the blocking wall structure by a full-surface evaporation method, and wherein the blocking wall structure has a height larger than or equal to that of the OLED light emitting unit.

2. The method according to claim 1, wherein forming on the insulating layer the resonant chamber which is provided opposite to the ultrasonic generating and detecting device further comprises:

covering a top portion of the blocking wall structure by a packaging glass, such that the packaging glass, the substrate and the blocking wall structure collectively define the resonant chamber which is hollow.

* * * * *